United States Patent
Cappelani et al.

(10) Patent No.: US 6,800,898 B2
(45) Date of Patent: Oct. 5, 2004

(54) INTEGRATED CIRCUIT CONFIGURATION AND METHOD OF FABRICATING A DRAM STRUCTURE WITH BURIED BIT LINES OR TRENCH CAPACITORS

(75) Inventors: Annalisa Cappelani, Dresden (DE); Bernhard Sell, Dresden (DE); Josef Willer, Riemerling (DE)

(73) Assignee: Infineon Technologies AG, Munich (DE)

( * ) Notice: Subject to any disclaimer, the term of this patent is extended or adjusted under 35 U.S.C. 154(b) by 248 days.

(21) Appl. No.: 09/951,239

(22) Filed: Sep. 12, 2001

(65) Prior Publication Data

US 2003/0034512 A1 Feb. 20, 2003

Related U.S. Application Data

(63) Continuation of application No. PCT/DE00/00757, filed on Mar. 10, 2000.

(30) Foreign Application Priority Data

Mar. 12, 1999 (DE) .......................................... 199 11 149

(51) Int. Cl.[7] .............................................. H01L 29/76
(52) U.S. Cl. ...................... 257/329; 438/268; 438/270
(58) Field of Search ................................ 257/302, 329; 438/268, 270

(56) References Cited

U.S. PATENT DOCUMENTS 4,864,375 A * 9/1989 Teng et al. .................. 257/302
5,410,169 A    4/1995 Yamamoto et al.
5,633,200 A    5/1997 Hu
5,670,805 A    9/1997 Hammerl et al.
6,348,709 B1 * 2/2002 Graettinger et al. ........ 257/311

FOREIGN PATENT DOCUMENTS

| EP | 03011735 | 1/1991 |
| EP | 0 462 576 A1 | 12/1991 |
| EP | 0 621 632 A1 | 10/1994 |
| EP | 0 987 765 A2 | 3/2000 |
| JP | 63263758 | 10/1988 |

* cited by examiner

*Primary Examiner*—Douglas Wille
(74) *Attorney, Agent, or Firm*—Laurence A. Greenberg; Werner H. Stemer; Gregory L. Mayback

(57) ABSTRACT

The bottom and the sides of a lower part of recess formed in the substrate has an insulating structure. A first part of the conductive structure of a first electric conductivity type is located in the lower part of the recess. A second part of the conductive structure of a second electric conductivity type, lower than the first type, is located in an upper part and borders the region of the substrate at the sides of the recess. The conductive structure has a diffusion barrier between its first and second parts. The conductive structure is configured as a bit line of a DRAM cell configuration with a vertical transistor, whereby S/Du represents the lower source/drain area and S/Do represents the upper source/drain area connected to a memory capacitor. Or, the conductive structure is configured as a memory capacitor and the upper source drain/area is connected to a bit line.

18 Claims, 3 Drawing Sheets

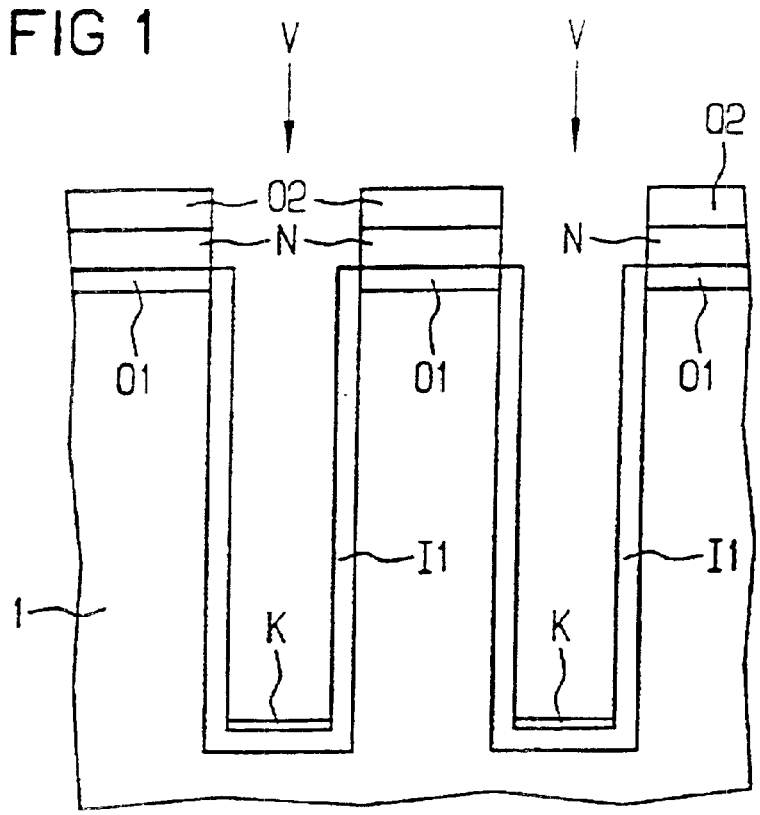
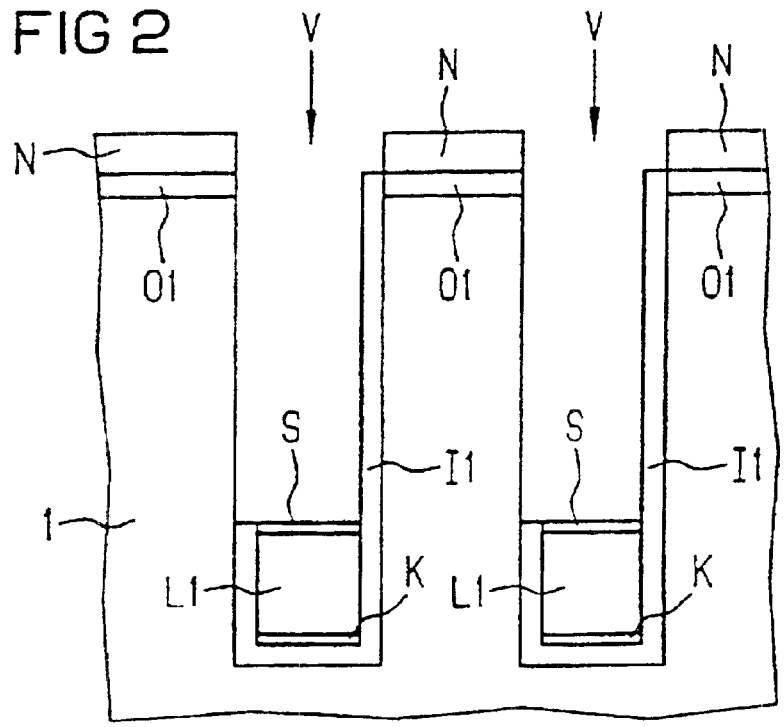

INTEGRATED CIRCUIT CONFIGURATION AND METHOD OF FABRICATING A DRAM STRUCTURE WITH BURIED BIT LINES OR TRENCH CAPACITORS

CROSS-REFERENCE TO RELATED APPLICATION

This is a continuation of copending International Application PCT/DE00/00757, filed Mar. 10, 2000, which designated the United States.

BACKGROUND OF THE INVENTION

FIELD OF THE INVENTION

The invention relates to an integrated circuit configuration comprising a conductive structure, which is buried in a substrate and is electrically connected to a region of the substrate, and also to a method for fabricating it.

U.S. Pat. Nos. 5,937,296 and 6,200,851 (see European patent publication EP 0 852 396 A2) describe an integrated circuit configuration, i.e. a circuit configuration which is arranged in a substrate, which is configured as a DRAM cell configuration. A memory cell of the DRAM cell configuration comprises a storage capacitor and a transistor. A storage node of the storage capacitor is buried in the substrate and adjoins a source/drain region of the transistor, which is configured as a doped region of the substrate. For each memory cell, a depression is produced in the substrate. A bottom and sidewalls of a lower part of the depression are provided with a capacitor dielectric. The lower part of the depression is filled with doped polysilicon, thereby producing the storage node. Afterward, further doped polysilicon is introduced into the depression, the polysilicon directly adjoining the substrate on a sidewall of the depression. As a result of a heat treatment step, dopant of the polysilicon diffuses into the substrate, where it forms the source/drain region of the transistor. After the production of a gate dielectric, a gate electrode is produced above the storage node in the depression. A further source/drain region of the transistor is produced above the source/drain region, with the result that the transistor is a vertical transistor wherein a channel current runs perpendicularly with respect to a surface of the substrate.

U.S. Pat. No. 5,497,017 describes an integrated circuit configuration which is a DRAM cell configuration. A memory cell of the DRAM cell configuration comprises a storage capacitor and a transistor. A bit line is buried in a substrate and electrically connected to a source/drain region of the transistor. In order to produce the bit line, a trench is produced in the substrate, the sidewalls and bottom of which trench are provided with an insulating structure. The trench is filled with tungsten, the bit line thereby being produced. Afterward, a part of the substrate and of the insulating structure is removed on an upper part of a sidewall of the trench, with the result that the bit line is laterally uncovered. The source/drain region of the transistor is subsequently produced by means of selective epitaxy. By means of further selective epitaxy, a channel region arranged above the source/drain region and a further source/drain region arranged above the channel region are produced. The transistor is configured as a vertical transistor.

K. Nakajima "Formation mechanism of ultrathin WSiN barrier layer in a W/WN$_x$/Si system", Applied Surface Science 117/118 (1997), 312, describes a gate electrode having a high electrical conductivity. A lower part of the gate electrode, which adjoins a gate dielectric, is composed of doped polysilicon. An upper part of the gate electrode is composed of tungsten. A diffusion barrier containing nitrogen is arranged between the upper part and the lower part of the gate electrode. The diffusion barrier comprises a layer containing the elements Si, N and W. The diffusion barrier prevents the tungsten from being siliconized in particular at higher temperatures, which would lead to a lower electrical conductivity of the gate electrode. In order to produce the diffusion barrier, a tungsten target is sputtered in a gas mixture comprising Ar and $N_2$.

SUMMARY OF THE INVENTION

It is accordingly an object of the invention to provide an integrated circuit configuration comprising a conductive structure which is buried in a substrate and is electrically connected to a region of the substrate, which overcomes the above-mentioned disadvantages of the heretofore-known devices and methods of this general type and which can be fabricated with low process complexity and in the case of which, at the same time, the conductive structure can have a high electrical conductivity. It is a further object of the invention to specify a method for fabricating such an integrated circuit configuration and a method of producing a DRAM structure with buried bit lines or trench capacitors.

With the foregoing and other objects in view there is provided, in accordance with the invention, an integrated circuit configuration, comprising:

a substrate having a depression formed therein with a bottom, sidewalls, a lower part, and a higher part;

an insulating structure formed on the bottom and sidewalls of the lower part of the depression;

a conductive structure having a first part with a first electrical conductivity disposed in the lower part of the depression, and a second part having a second electrical conductivity, lower than the first electrical conductivity, disposed in the higher part of the depression and adjoining a region of the substrate at a portion of at least one of the sidewalls of the depression; and a diffusion barrier arranged between the first part and the second part of the conductive structure.

In other words, the problems associated with the above state of the art are solved with the novel integrated circuit configuration that comprises a conductive structure, which is buried in a substrate and is electrically connected to a region of the substrate, wherein the conductive structure comprises a first part, a second part and a diffusion barrier. The substrate has a depression. A bottom and sidewalls of a lower part of the depression are provided with an insulating structure. The first part of the conductive structure, which has a first electrical conductivity, is arranged in the lower part of the depression. The second part of the conductive structure, which has a second electrical conductivity, which is lower than the first electrical conductivity, is arranged in a higher part of the depression and adjoins the region of the substrate at a part of at least one of the sidewalls of the depression. The diffusion barrier is arranged between the first part and the second part of the conductive structure.

In accordance with an added feature of the invention, the first part of the conductive structure contains a metal (preferably tungsten); the second part of the conductive structure contains polysilicon; and the diffusion barrier contains nitrogen (preferably tungsten, silicon, and nitrogen).

In accordance with an additional feature of the invention, the substrate contains silicon; the polysilicon of the second part of the conductive structure is doped polysilicon; and the substrate is doped in the region of the substrate adjoined by the second part of the conductive structure.

In accordance with another feature of the invention, the integrated circuit configuration is configured as a DRAM cell configuration with memory cells each having at least one transistor. In one embodiment, the conductive structure forms a bit line; and the region of the substrate adjoined by the second part of the conductive structure is a source/drain region of the transistor.

In accordance with again a further feature of the invention, an insulation covers the conductive structure and portions of the sidewalls of the depression above the conductive structure; a gate electrode of the transistor is disposed in the depression and isolated from the conductive structure and the substrate by the insulation; and a further source/drain region of the transistor is disposed above the source/drain region and adjoins the sidewall of the depression.

In accordance with again an alternative embodiment of the invention, the integrated circuit configuration is configured as a DRAM cell configuration with memory cells each having at least one transistor and a capacitor. In that case, the conductive structure forms a storage node of the capacitor; the insulating structure is configured to act as a capacitor dielectric of the capacitor; and the region of the substrate adjoined by the second part of the conductive structure is a source/drain region of the transistor.

In accordance with a concomitant feature of the invention, an insulation covers the conductive structure and portions of the sidewalls of the depression above the conductive structure; a gate electrode of the transistor is disposed in the depression and isolated from the conductive structure and the substrate by the insulation; and a further source/drain region of the transistor is disposed above the source/drain region and adjoins the sidewall of the depression.

With the above and other objects in view there is also provided, in accordance with the invention, a method of fabricating an integrated circuit configuration, which comprises the steps of:

forming a depression in a substrate;

providing a bottom and sidewalls of a lower part of the depression with an insulating structure;

producing a first part of a conductive structure, having a first electrical conductivity, in the lower part of the depression;

applying a material on the first part of the conductive structure;

producing a second part of the conductive structure, having a second electrical conductivity, less than the first electrical conductivity, on the material in a higher part of the depression and adjoining the substrate at a portion of at least one of the sidewalls of the depression; and producing a diffusion barrier between the first part and the second part of the conductive structure with the aid of the material.

In other words, the above-noted objects of the invention are achieved with the novel method for fabricating an integrated circuit configuration comprising a conductive structure, which is buried in a substrate and is electrically connected to a region of the substrate. First, a depression is produced in the substrate. A bottom and sidewalls of a lower part of the depression are provided with an insulating structure. A first part of the conductive structure, which has a first electrical conductivity, is produced in such a way that it is arranged in the lower part of the depression. Afterward, a material is applied to the first part of the conductive structure. A second part of the conductive structure, which has a second electrical conductivity, which is lower than the first electrical conductivity, is produced on the material in such a way that it is arranged in a higher part of the depression and adjoins the region of the substrate at a part of at least one of the sidewalls of the depression. A diffusion barrier, which is likewise part of the conductive structure, is produced between the first part and the second part of the conductive structure with the aid of the material.

The diffusion barrier makes it possible that the first part of the conductive structure can be composed of a material, which diffuses easily into a material of which the substrate is composed, or reacts with the material of the substrate. If the substrate is composed of silicon, for example, then the first part of the conductive structure may contain a metal, without a metal silicide, which has a lower electrical conductivity, being formed from the metal in the event of a temperature increase.

The diffusion barrier may be composed of insulating material and have a thickness, which enables the tunneling of electrons. The insulating material may be e.g. $SiO_2$ or silicon nitride.

Preferably, the diffusion barrier is essentially composed of conductive material in order that a contact resistance between metal of the first part and silicon of the second part of the conductive structure is particularly small and, consequently, a higher electrical conductivity of the conductive structure is ultimately achieved.

Such a diffusion barrier has the effect, moreover, that a thin oxide layer, which may be produced in an undesirable manner on the metal through contact with oxygen is perforated.

The first part of the conductive structure is responsible for a high electrical conductivity of the conductive structure. The process complexity for fabricating the integrated circuit configuration can be low on account of the second part of the conductive structure, because even after the production of the conductive structure, method steps at high temperatures are possible without any loss of the high electrical conductivity of the conductive structure. Thus, e.g. source/drain regions or gate dielectrics of transistors can be produced by implantation and heat treatment. Complex epitaxy can be dispensed with.

The second part of the conductive structure preferably contains a material, which does not easily diffuse into the material of the substrate. The second part of the conductive structure preferably contains polysilicon if the substrate contains silicon.

The diffusion barrier contains nitrogen, for example.

Tungsten is particularly suitable as material of the first part of the conductive structure if the substrate is composed of silicon, since the thermal expansion coefficient of silicon and the thermal expansion coefficient of tungsten are very similar, with the result that, even though the first part of the conductive structure is buried in the substrate, mechanical strain in the event of temperature changes and defects resulting therefrom are avoided. If the first part of the conductive structure is composed of tungsten, then the diffusion barrier contains nitrogen, tungsten and silicon.

It lies within the scope of the invention to produce the first part of the conductive structure from a different metal, for example molybdenum, titanium, niobium, ruthenium or tantalum.

The region of the substrate adjoined by the second part of the conductive structure can be doped. By way of example, the region of the substrate is a source/drain region of a transistor. In order to simplify the fabrication method, it is advantageous if, in this case, the polysilicon of the second part of the conductive structure is doped by the same conductivity type as the region of the substrate. In this case, the region of the substrate can be produced in a simple manner in that, with the aid of a heat treatment step, dopant of the polysilicon of the second part of the conductive structure diffuses into the substrate, where it forms the region of the substrate.

The first part of the conductive structure can be produced by depositing material. The depression is filled with the material. Afterward, the material is etched back as far as the desired depth. The material of the first part of the conductive structure is preferably deposited by means of a CVD method, with the result that the first part of the conductive structure has horizontally running fibers, i.e. elongate crystallites, which are arranged on sidewalls of the depression.

It is possible to use a seed layer, which covers the sidewalls and the bottom of the depression.

Such a method is particularly rapid if the depression is more than twice as deep as it is wide, since the depression is filled independently of its depth if the thickness of the deposited material corresponds to half the width of the depression.

The seed layer can be produced for example by depositing a small quantity of material of which the seed layer is composed. However, it is also possible to dispense with the seed layer.

As an alternative, the first part of the conductive structure can be produced by selective growth on a seed layer. To that end, a seed layer is produced after the production of the insulating structure on a part of the insulating structure which is arranged at the bottom of the depression. The selective growth is directed from the bottom to the top, with the result that the first part of the conductive structure has longitudinal fibers extending from the bottom to the top. In contrast to the CVD method, there is no risk of a joint—on account of which the bottom of the depression can be attacked during the etching-back process—forming in the middle of the depression. Furthermore, it is not necessary to etch back material. The height of an upper surface of the first part of the conductive structure is determined by growth and not by the difference between etching depths, namely the depth during the etching-back process and the depth of the depression, with the result that said height can be set more accurately.

The seed layer can be produced for example by implantation or by sputtering, preferably highly directed sputtering (e.g. ionized metal PVD). In the course of sputtering, material is also deposited on side walls of the depression and also outside the depression. In the case of highly directed sputtering, a very large proportion of the sputtered particles have the same angle of incidence. Material applied outside the depression can be removed for example by chemical mechanical polishing or by etching with the aid of a resist mask which fills the depression. Material applied on the sidewalls of the depression can be removed e.g. by isotropic etching. If the first part of the conductive structure is composed of tungsten or ruthenium, then the seed layer is preferably composed of the same corresponding metal or of silicon.

The seed layer preferably has a thickness of between 1 nm and 5 nm. If the seed layer is composed of silicon, then a thicker seed layer could lead to the formation of a non-negligible amount of metal silicide, which would bring about an increase in the electrical resistance of the conductive structure.

The first part of the conductive structure can also be produced by sputtering. A seed layer is not necessary in this case. Highly directed sputtering is particularly advantageous since a particularly small amount of material is deposited on sidewalls of the depression, with the result that a short isotropic etching step suffices to remove the material on the sidewalls of the depression above the first part of the conductive structure.

The diffusion barrier can be produced by implanting nitrogen after the production of the first part of the conductive structure. After the production of the second part of the conductive structure, the diffusion barrier is produced from the nitrogen and adjoining parts of the conductive structure with the aid of a heat treatment step.

As an alternative, after the production of the first part of the conductive structure, it is possible to deposit a metal nitride containing the same metal as the metal of the first part of the conductive structure. The diffusion barrier is produced from the metal nitride and a part of the second part of the conductive structure by means of a heat treatment step.

The diffusion barrier can also partly be formed from the first part of the conductive structure. To that end, the first part of the conductive structure is produced from metal nitride. With the aid of a heat treatment step, nitrogen of the metal nitride diffuses to an upper area of the first part of the conductive structure. A nitrogen-enriched layer of the first part of the conductive structure is part of the diffusion barrier.

The integrated circuit configuration may be, for example, a DRAM cell configuration having memory cells each having at least one transistor. The region of the substrate adjoined by the second part of the conductive structure is, for example, a source/drain region of the transistor.

The conductive structure can act as a bit line. In this case, the insulating structure is thick enough to avoid an appreciable capacitance between the bit line and the substrate.

As an alternative, the conductive structure can act as a storage node of a capacitor, which is likewise part of the memory cell. In this case, the insulating structure is configured in such a way that it can act as a capacitor dielectric of the capacitor.

In order to increase the packing density, the transistor can be configured as a vertical transistor. A further source/drain region of the transistor is arranged above the source/drain region and adjoins the sidewall of the depression at which the second part of the conductive structure adjoins the source/drain region. A channel region of the transistor is arranged between the further source/drain region and the source/drain region. An insulation covers the conductive structure and parts of the sidewalls of the depression which are arranged above the conductive structure. A gate electrode of the transistor is arranged in the depression and is isolated from the conductive structure and from the substrate by the insulation. In the region of the channel region, the insulation acts as a gate dielectric.

At least a part of the insulation can be produced by thermal oxidation.

The transistor may alternatively be configured as a planar transistor.

In order to increase the packing density, it is advantageous if the second part of the conductive structure adjoins the region of the substrate on only one sidewall of the depression. In this case, depressions of different memory cells can be arranged at a small distance from one another without leakage currents occurring between mutually adjacent conductive structures.

Other features which are considered as characteristic for the invention are set forth in the appended claims.

Although the invention is illustrated and described herein as embodied in method for fabricating a dram structure with buried bit lines or trench capacitors, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a section through a first substrate after the production of a first oxide layer, a nitride layer, a second oxide layer, a depression, an insulating structure and a seed layer;

FIG. 2 is the same section taken after a first part of a conductive structure and a layer containing nitrogen have been produced and a part of the insulating structure and the second oxide layer have been removed;

Figure 3:
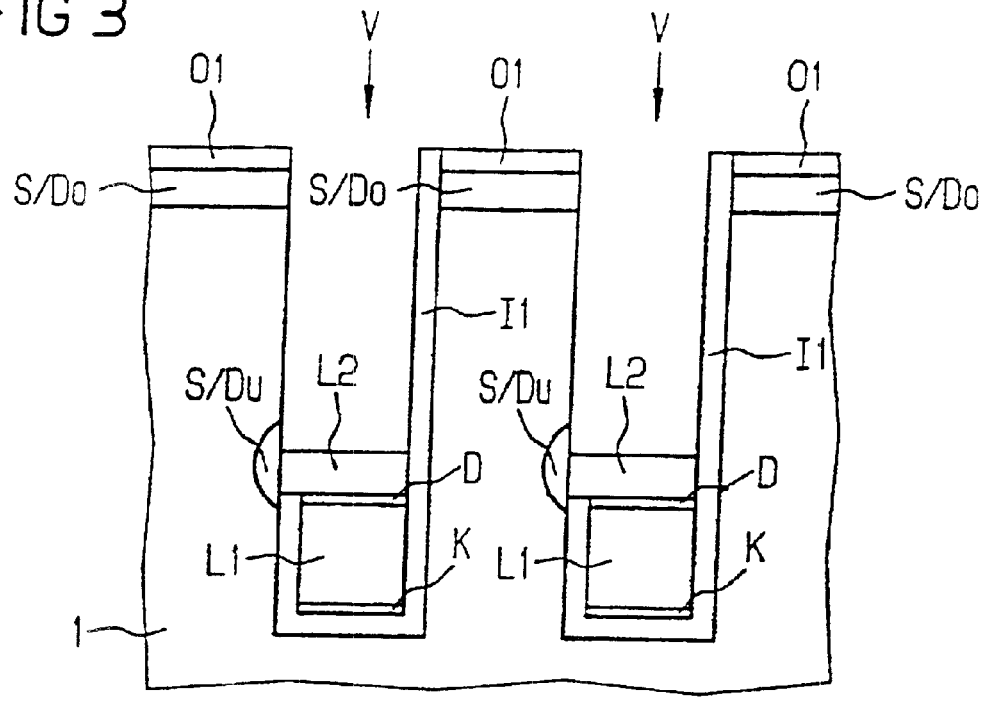
FIG. 3 is the same section after a second part of the conductive structure, upper source/drain regions of transistors and lower source/drain regions of the transistors have been produced and the nitride layer has been removed.

It will be understood by those skilled in the pertinent art that the drawing figures are not true to scale.

DESCRIPTION OF THE PREFERRED EMBODIMENTS

In a first exemplary embodiment, a first substrate 1 is provided that is made of monocrystalline silicon.

Referring now to the figures of the drawing in detail and first, particularly, to FIG. 1 thereof, in order to produce a mask, a first oxide layer O1 is produced in that $SiO_2$ is formed to a thickness of approximately 20 nm by means of thermal oxidation. Silicon nitride is deposited over that to a thickness of approximately 50 nm. This results in a nitride layer N. In order to produce a second oxide layer O2, $SiO_2$ is deposited to a thickness of approximately 200 nm (see FIG. 1).

With the aid of a non-illustrated first strip-type photoresist mask, whose strips have a width of approximately 100 nm and have a spacing of approximately 100 nm from one another, the second oxide layer O1, the nitride layer N and the first oxide layer O1 are patterned, with the result that the substrate 1 is partly uncovered (see FIG. 1).

Afterward, the substrate 1 is etched to a depth of approximately 500 nm using, for example HBr. This results in the production of depressions V having strip-type horizontal cross sections. In this case, the patterned second oxide layer O1, the nitride layer N and the first oxide layer O1 act as a mask.

In order to produce an insulating structure I1 having a thickness of approximately 10 nm, a thermal oxidation is carried out (see FIG. 1). The insulating structure I1 covers sidewalls and bottoms of the depressions V.

Afterward, an implantation of silicon is carried out at an energy of approximately 5 keV and a dose of approximately $5*10^{15}$ $cm^{-2}$. This results in a seed layer K having a thickness of approximately 2 nm to be produced on the bottoms of the depressions V after a heat treatment step at approximately 800° C. (see FIG. 1).

In a CVD method, tungsten is grown selectively on the seed layer K, with the result that first parts L1 of conductive structures are produced in lower parts of the depressions V (see FIG. 2). The first parts L1 of the conductive structures have a thickness of approximately 100 nm.

Afterward, an implantation of nitrogen is carried out at an energy of approximately 10 keV and a dose of $5*10^{15}$ $cm^{-2}$, with the result that a nitrogen-containing layer S is produced on the first parts L1 of the conductive structures.

The second oxide layer O1 is removed by chemical mechanical polishing.

With the aid of a strip-type second photoresist mask (not illustrated), whose strips cover first sidewalls of the depressions V, parts of the insulating structure I1 which are arranged above the first parts of the conductive structures L1 on second sidewalls—opposite the first sidewalls—of the depressions V are removed using, for example, HF (see FIG. 2). The second photoresist mask is subsequently removed.

In order to produce second parts L2 of the conductive structures, in-situ-doped polysilicon is deposited to a thickness of approximately 50 nm, thereby filling the depressions V. Afterward, the polysilicon is planarized by chemical mechanical polishing until the nitride layer N is uncovered. By means of implantation with n-doping ions, upper source/drain regions S/Do of transistors are produced, which are arranged between mutually adjacent depressions V (see FIG. 3). The polysilicon is then etched back, with the result that the second parts—having a thickness of approximately 20 nm of the conductive structures L2 are produced in higher parts of the depressions V (see FIG. 3).

In order to remove etching residues on the sidewalls of the depressions V, a thermal oxide (not illustrated) having a thickness of approximately 3 nm is produced and then removed again. In this case, dopant diffuses from the second parts L2 of the conductive structures into the substrate 1, where it forms lower source/drain regions S/Du of the transistors (see FIG. 3). The high temperature during the thermal oxidation has the effect, moreover, that diffusion barriers D are produced from the nitrogen-containing layer S, from tungsten of the first parts of the conductive structures L1 and from silicon of the second parts of the conductive structures L2 on account of limited inter-diffusion (see FIG. 3).

The nitride layer N is removed with the aid of phosphoric acid (see FIG. 3). Afterward, an implantation with oxygen is carried out, with the result that the first oxide layer O1 and upper parts of the second parts L2 of the conductive structures are doped with oxygen.

In order to produce an insulation I2, a thermal oxidation is carried out. On account of the oxygen implantation, the insulation I2 grows to a greater thickness on the second parts L2 of the conductive structures than on the second sidewalls of the depressions V. On the second sidewalls of the depressions V, the thickness of the insulation I2 is approximately 5 nm (see FIG. 4).

Figure 4:
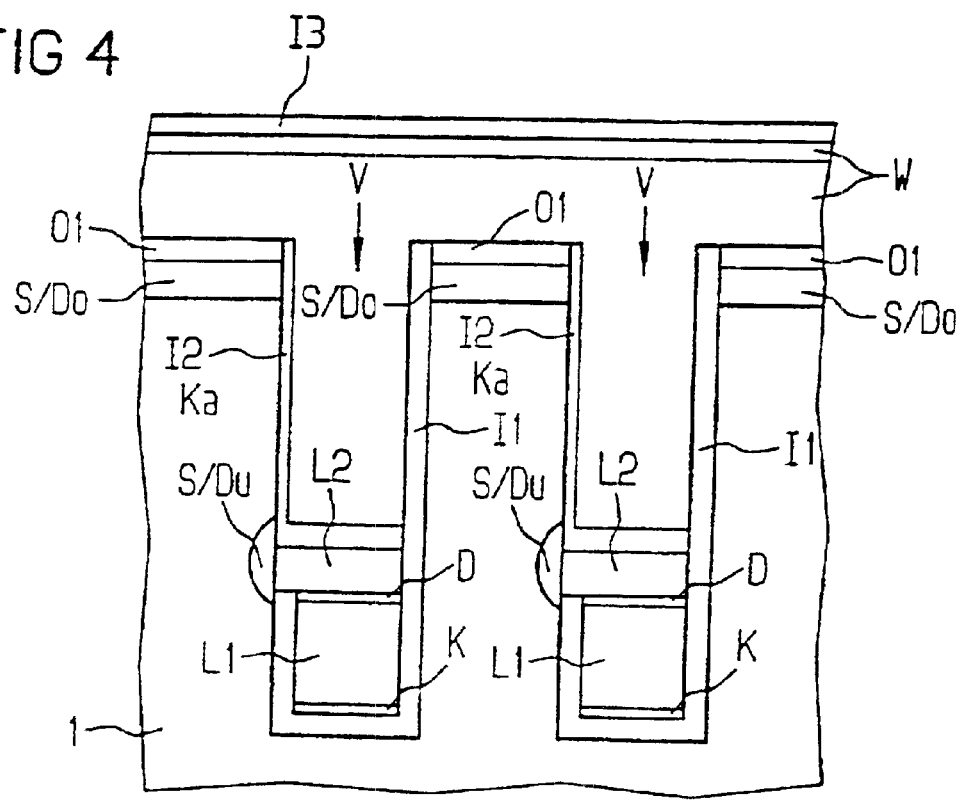
FIG. 4 is the same section after the production of an insulation, word lines, a diffusion barrier, and a further insulation.

In order to produce word lines W, in-situ-doped polysilicon is deposited to a thickness of approximately 50 nm, thereby filling the depressions V (see FIG. 4). Tungsten silicide is deposited over that to a thickness of approximately 80 nm. In order to produce a further insulation 13, silicon nitride is deposited to a thickness of approximately 50 nm.

With the aid of a strip-type third photoresist mask (not illustrated), whose strips run transversely with respect to the strips of the first photoresist mask, have a width of approximately 100 nm and have a spacing of approximately 100 nm from one another, silicon nitride, tungsten silicide and polysilicon are etched selectively with respect to $SiO_2$ until parts of the insulation I2 which are arranged on the second parts L2 of the conductive structures are uncovered. The word lines W are thereby produced from the tungsten silicide and the polysilicon.

Afterward, $SiO_2$ is deposited and etched back until the substrate 1 is uncovered.

In order to isolate the upper source/drain regions S/Do and the lower source/drain regions S/Du of mutually adjacent transistors along one of the conductive structures, the substrate 1 is etched, thereby producing further depressions (not illustrated) between the word lines W and between the depressions V, which further depressions have a square horizontal cross section and reach more deeply than the higher parts of the depressions V. The upper source/drain regions S/Do are consequently arranged under the word lines W.

Parts of the word lines W, which are arranged in the depressions V above the second parts L2 of the conductive structures act as gate electrodes of the transistors. Parts of the insulation I2, which are arranged on the second sidewalls of the depressions V act as a gate dielectric of the transistors. Parts of the substrate 1, which are arranged between the lower source/drain regions S/Du and the upper source/drain regions S/Do act as channel regions Ka of the transistors. The conductive structures act as bit lines. The conductive structures are buried in the substrate 1 and are connected to regions of the substrate 1, namely to the lower source/drain regions S/Du.

Storage capacitors are subsequently produced. The capacitors are each connected to an upper source/drain region S/Do of the transistors. A memory cell of the DRAM cell configuration produced by the method described comprises one of the transistors and one of the capacitors connected to the transistor.

In a second exemplary embodiment, a second substrate 2 made of monocrystalline silicon is provided. An n-doped layer P' having a thickness of approximately 7 µm is arranged approximately 1 µm below a surface of the substrate 2.

As in the first exemplary embodiment, a mask comprising a first oxide layer O1' is produced on a nitride layer and a second oxide layer. Depressions V' are subsequently produced, which, in contrast to the first exemplary embodiment, have a square horizontal cross section with a side length of approximately 100 nm and have a depth of approximately 7 µm. A first insulating structure I1' is produced, which, in contrast to the first exemplary embodiment, is composed of nitrogen oxide and has a thickness of approximately 7 nm.

Figure 5:
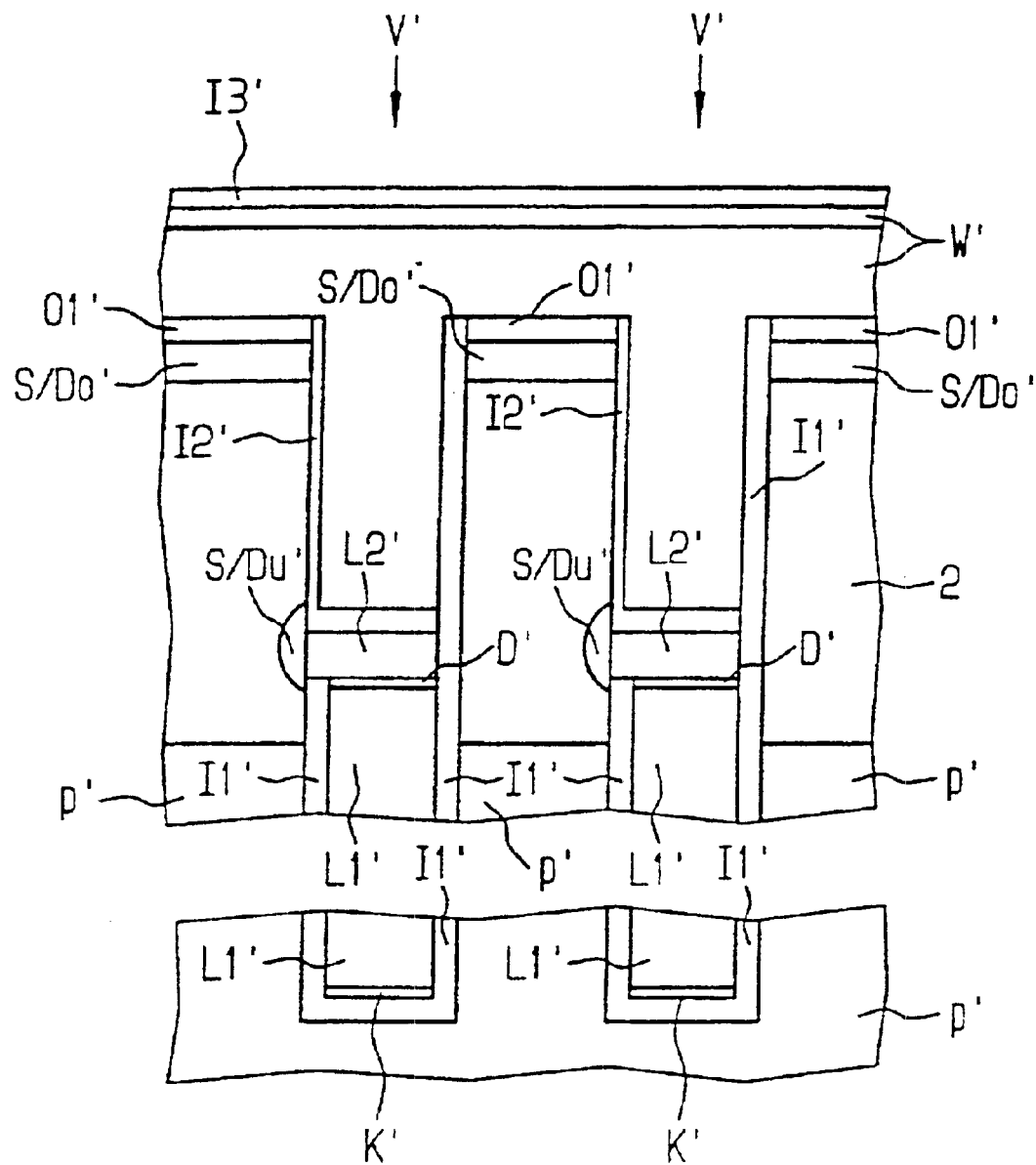
FIG. 5 is a section taken through a second substrate after the production of a first oxide layer, depressions, an insulating structure, conductive structures, lower source/drain regions of transistors, upper source/drain regions of the transistors, an insulation, a further insulation and word lines.

As in the first exemplary embodiment, a seed layer K', first parts L1' of conductive structures are produced, nitrogen is implanted, and parts of the insulating structures I1' are removed. As in the first exemplary embodiment, second parts L2' of the conductive structures, diffusion barriers D', upper source/drain regions S/Do', lower source/drain regions S/Du', an insulation I2', word lines W' and a further insulation I3' are produced (see FIG. 5).

The conductive structures act as storage nodes of storage capacitors. The insulating structure I1' acts as a capacitor dielectric of the storage capacitors. The doped layer P' of the substrate 2 acts as a common capacitor plate of the storage capacitors.

Afterward, non-illustrated bit lines are produced which run transversely with respect to the word lines W' and are connected to the upper source/drain regions S/Do' via contacts.

There are many conceivable variations of the exemplary embodiments, which likewise lie within the scope of the invention. In particular, the dimensions of the above-described layers, masks and depressions can be adapted to the respective requirements. The first parts of the conductive structures can be produced from other metals, such as e.g. molybdenum or tantalum.

The further depressions may alternatively be so shallow that they merely isolate the upper source/drain regions from one another without isolating the lower source/drain regions from one another. In this case, then, the further depressions do not reach more deeply than the higher parts of the depressions.

We claim:

1. An integrated circuit configuration, comprising:
   a substrate having a depression formed therein with a bottom, sidewalls, a lower part, and a higher part;
   an insulating structure formed on said bottom and sidewalls of said lower part of said depression;
   a conductive structure having a first part with a first electrical conductivity disposed in said lower part of said depression, and a second part having a second electrical conductivity, lower than the first electrical conductivity, disposed in said higher part of said depression and adjoining a region of said substrate at a portion of at least one of said sidewalls of said depression; and
   a diffusion barrier arranged between said first part and said second part of said conductive structure.

2. The integrated circuit configuration according to claim 1, wherein:
   said first part of said conductive structure contains a metal;
   said second part of said conductive structure contains polysilicon; and
   said diffusion barrier contains nitrogen.

3. The integrated circuit configuration according to claim 2, wherein:
   said metal is tungsten; and
   said diffusion barrier contains tungsten, silicon, and nitrogen.

4. The integrated circuit configuration according to claim 2, wherein:
   said substrate contains silicon;
   said polysilicon of said second part of said conductive structure is doped polysilicon;
   said substrate is doped in the region of said substrate adjoined by said second part of said conductive structure.

5. The integrated circuit configuration according to claim 4, wherein:
   said metal is tungsten; and
   said diffusion barrier contains tungsten, silicon, and nitrogen.

6. The integrated circuit configuration according to claim 4 configured as a DRAM cell configuration with memory cells each having at least one transistor and wherein:
   said conductive structure forms a bit line; and
   the region of said substrate adjoined by said second part of said conductive structure is a source/drain region of said transistor.

7. The integrated circuit configuration according to claim 6, which further comprises:
   an insulation covering said conductive structure and portions of said sidewalls of said depression above said conductive structure;
   and wherein a gate electrode of the transistor is disposed in said depression and isolated from said conductive structure and said substrate by said insulation; and
   a further source/drain region of the transistor is disposed above said source/drain region and adjoins said sidewall of said depression.

8. The integrated circuit configuration according to claim 4 configured as a DRAM cell configuration with memory cells each having at least one transistor and a capacitor and wherein:
   said conductive structure forms a storage node of the capacitor;
   said insulating structure is configured to act as a capacitor dielectric of the capacitor; and
   the region of said substrate adjoined by said second part of said conductive structure is a source/drain region of the transistor.

9. The integrated circuit configuration according to claim 8, which further comprises:
   an insulation covering said conductive structure and portions of said sidewalls of said depression above said conductive structure;
   and wherein a gate electrode of the transistor is disposed in said depression and isolated from said conductive structure and said substrate by said insulation; and
   a further source/drain region of the transistor is disposed above said source/drain region and adjoins said sidewall of said depression.

10. A method of fabricating an integrated circuit configuration, which comprises the steps of:
    forming a depression in a substrate;
    providing a bottom and sidewalls of a lower part of the depression with an insulating structure;
    producing a first part of a conductive structure, having a first electrical conductivity, in the lower part of the depression;
    applying a material on the first part of the conductive structure;
    producing a second part of the conductive structure, having a second electrical conductivity, less than the first electrical conductivity, on the material in a higher part of the depression and adjoining the substrate at a portion of at least one of the sidewalls of the depression; and
    producing a diffusion barrier between the first part and the second part of the conductive structure with the aid of the material.

11. The method according to claim 10, which comprises:
    forming the first part of the conductive structure with a metal;
    producing the second part of the conductive structure by depositing polysilicon and etching back the polysilicon; and
    forming the diffusion barrier with nitrogen.

12. The method according to claim 11, which comprises:
    carrying out an implantation after producing the insulating structure, for producing a seed layer on a portion of the insulating structure arranged at the bottom of the depression; and
    producing the first part of the conductive structure by selective growth on the seed layer.

13. The method according to claim 11, which comprises:
    subsequently to producing the first part of the conductive structure, implanting nitrogen, and subsequently producing the second part of the conductive structure; and
    producing the diffusion barrier in a heat treatment step.

14. The method according to claim 11, which comprises:
    providing a substrate containing silicon;
    doping the polysilicon of the second part of the conductive structure; and
    diffusing, with a heat treatment step, dopant of the second part of the conductive structure into the substrate and thereby doping the region of the substrate adjoined by the second part of the conductive structure.

15. The method according to claim 12, wherein the metal is tungsten.

16. The method according to claim 14, which comprises:
    producing the integrated circuit configuration as a DRAM cell configuration having memory cells;
    producing at least one transistor for each of the memory cells;
    forming the region of the substrate adjoined by the second part of the conductive structure as a source/drain region of the transistor; and
    forming the conductive structure as a bit line.

17. The method according to claim 14, which comprises:
    producing the integrated circuit configuration as a DRAM cell configuration having memory cells;
    producing at least one transistor and a capacitor for each of the memory cells;
    forming the region of the substrate adjoined by the second part of the conductive structure as a source/drain region of the transistor;
    producing the conductive structure as a storage node of the capacitor; and
    producing the insulating structure such that the insulating structure can form a capacitor dielectric of the capacitor.

18. The method according to claim 16, which comprises:
    carrying out thermal oxidation after producing the second part of the conductive structure, for forming an insulation covering the conductive structure and portions of the sidewalls of the depression arranged above the conductive structure;
    after the production of the insulation, producing a gate electrode of the transistor in the depression, which is isolated from the conductive structure and from the substrate by the insulation; and
    producing a further source/drain region of the transistor above the source/drain region to adjoin the sidewall of the depression.

* * * * *